United States Patent
Uribe et al.

(10) Patent No.: US 6,747,893 B2
(45) Date of Patent: Jun. 8, 2004

(54) STORING DATA IN NON-VOLATILE MEMORY DEVICES

(75) Inventors: Sebastian T. Uribe, El Dorado Hills, CA (US); Daniel R. Elmhurst, Cameron Park, CA (US)

(73) Assignee: Intel Corporation, Santa Clara, CA (US)

(*) Notice: Subject to any disclaimer, the term of this patent is extended or adjusted under 35 U.S.C. 154(b) by 87 days.

(21) Appl. No.: 10/099,678

(22) Filed: Mar. 14, 2002

(65) Prior Publication Data

US 2003/0174538 A1 Sep. 18, 2003

(51) Int. Cl.$^7$ .............................................. G11C 16/04
(52) U.S. Cl. .............................. 365/185.03; 365/185.09
(58) Field of Search ........................ 365/185.03, 185.18, 365/185.19, 185.22, 185.33

(56) References Cited

U.S. PATENT DOCUMENTS

| | | | |
|---|---|---|---|
| 5,450,363 A | 9/1995 | Christopherson et al. ... | 365/205 |
| 5,485,422 A | 1/1996 | Bauer et al. ................. | 365/168 |
| 5,487,033 A | 1/1996 | Keeney et al. .......... | 365/185.03 |
| 5,497,354 A | 3/1996 | Sweha et al. ................ | 365/207 |
| 5,515,317 A | 5/1996 | Wells et al. ............ | 365/185.03 |
| 5,537,350 A * | 7/1996 | Larsen et al. .......... | 365/185.33 |
| 5,539,690 A | 7/1996 | Talreja et al. .......... | 365/185.22 |
| 5,553,020 A | 9/1996 | Keeney et al. .......... | 365/185.19 |
| 5,574,879 A | 11/1996 | Wells et al. ............ | 365/185.03 |
| 5,594,691 A | 1/1997 | Bashir ....................... | 365/207 |
| 5,621,685 A * | 4/1997 | Cernea et al. .......... | 365/185.18 |
| 5,671,388 A | 9/1997 | Hasbun ................. | 365/185.03 |
| 5,737,265 A | 4/1998 | Atwood et al. ......... | 365/185.03 |
| 5,781,472 A | 7/1998 | Sweha et al. .......... | 365/185.11 |
| 5,796,667 A | 8/1998 | Sweha et al. ................ | 365/207 |
| 5,801,991 A | 9/1998 | Keeney et al. .......... | 365/185.23 |
| 5,815,434 A | 9/1998 | Hasbun et al. ......... | 365/185.03 |
| 5,815,443 A | 9/1998 | Sweha et al. .......... | 365/189.05 |
| 5,822,256 A | 10/1998 | Bauer et al. ................ | 365/200 |
| 5,889,701 A * | 3/1999 | Kang et al. ............ | 365/185.18 |
| 5,936,884 A | 8/1999 | Hasbun et al. ......... | 365/185.03 |
| 5,946,258 A | 8/1999 | Evertt et al. ................ | 365/226 |
| 5,973,957 A | 10/1999 | Tedrow ................. | 365/185.03 |
| 6,088,266 A * | 7/2000 | Roohparvar ........... | 365/185.19 |
| 6,097,637 A | 8/2000 | Bauer et al. ........... | 365/185.24 |
| 6,115,290 A | 9/2000 | Kwong .................. | 365/185.25 |
| 6,134,145 A * | 10/2000 | Wong .................... | 365/185.22 |
| 6,163,225 A | 12/2000 | Sundaram et al. ............ | 331/57 |
| 6,166,955 A * | 12/2000 | Lu et al. ................ | 365/185.18 |
| 6,418,059 B1 * | 7/2002 | Kreifels et al. ........ | 365/185.18 |
| 6,549,463 B2 * | 4/2003 | Ogura et al. ........... | 365/185.18 |
| 2002/0126537 A1 | 9/2002 | Kreifels et al. | |
| 2003/0123295 A1 | 7/2003 | Elmhurst et al. | |

OTHER PUBLICATIONS

Marc Landgraf, "Innovations in Flash Memory Design," EEC 290 Seminar, Oct. 13, 2000.

* cited by examiner

*Primary Examiner*—Trong Phan
(74) *Attorney, Agent, or Firm*—Fish & Richardson P.C.

(57) ABSTRACT

Cells in a non-volatile memory are programmed in parallel using a variable program bandwidth. The variable program bandwidth is an automatic variation in the number of cells pulsed in parallel based upon a predefined electrical current provisioning capability. The variation in programming number may be based upon whether a program pulse represents an initial pulse or a re-pulse. Additionally, or alternatively, the variation in programming number may be based upon a cell level to be programmed by a pulse in a MLC device.

29 Claims, 8 Drawing Sheets

STORING DATA IN NON-VOLATILE MEMORY DEVICES

BACKGROUND

The present application describes systems and techniques relating to storing data in non-volatile memory devices, for example, program pulsing in flash memory.

Non-volatile memory devices include random access memory (RAM) devices and read-only memory (ROM) devices. Traditionally, a ROM device was not generally re-writable. For example, an early type of programmable ROM used one time programmable (OTP) memory cells having a diode or a transistor with a fuse or an antifuse to store a bit of data.

Traditional electrically programmable read-only memory (EPROM) included one time programmable cells that used trapped charges underneath transistor gates to store data by changing transistor threshold voltage. EPROM cells were made erasable through the use of ultraviolet (UV) light to reduce or remove trapped charges. This UV erasing made EPROM cells re-writable.

Later developments included the electrically erasable programmable read-only memory (EEPROM) and flash memory, which may be programmed while in circuit on a printed circuit board. The EEPROM cell and the flash cell each include a transistor that uses a floating gate to store a charge. This charge may be applied (programmed) or removed (erased) as desired. Thus, many non-volatile memories are fully re-writable, despite being labeled as ROMs.

In addition, some non-volatile memories are multi-level memories capable of storing more than one bit of data in each storage cell. For example, multi-level cell (MLC) flash memories have been developed by Intel Corporation, located at 2080 Mission College Boulevard, Santa Clara Calif., 95052-8119. These flash memories store two bits of data in each cell using four memory states instead of the traditional two memory states in single-bit cell (SBC) memories.

In many non-volatile memories, a charge pump in the same circuit is used to generate voltage and current to program or erase storage cells in the memory. Typically, these storage cells are programmed in parallel in groups of cells. For a given voltage level, a programming time period is needed to program the storage cells in a group.

Details of one or more embodiments are set forth in the accompanying drawings and the description below. Other features and advantages may be apparent from the description and drawings, and from the claims.

DETAILED DESCRIPTION

The systems and techniques described here relate to storing data in non-volatile memory devices. The description that follows discusses programming non-volatile memory in the context of EEPROM and flash memory devices, but may apply equally in other contexts.

As used herein, the terms "program" and "programming" when use in connection with a memory cell mean storing data in the memory cell, such as by pulsing the memory cell to modify a threshold voltage of the cell. The term "chunk" means a set of memory cells to be programmed. The terms "group" and "group of cells" mean a set of memory cells from a chunk that are to be programmed in parallel. The terms "program bandwidth" and "bandwidth" mean a group size being used to program cells in parallel.

Cells in a non-volatile memory are programmed in parallel using a variable program bandwidth. The variable program bandwidth is an automatic variation in the number of cells pulsed in parallel (i.e., automatic variation of the group size) based upon a predefined electrical current provisioning capability. By automatically varying the programming number of the storage cells during program pulsing, various advantages in storage speed and/or reduced program pump size for the non-volatile memory may be achieved.

In general, performance for the non-volatile memory device may be improved for a given program pump size, or program pump size may reduced, while still achieving a given target performance. The variation in programming number may be based upon whether a program pulse represents an initial pulse or a re-pulse. Additionally, or alternatively, the variation in programming number may be based upon a cell level to be programmed by a pulse in a MLC device.

Figure 1A:
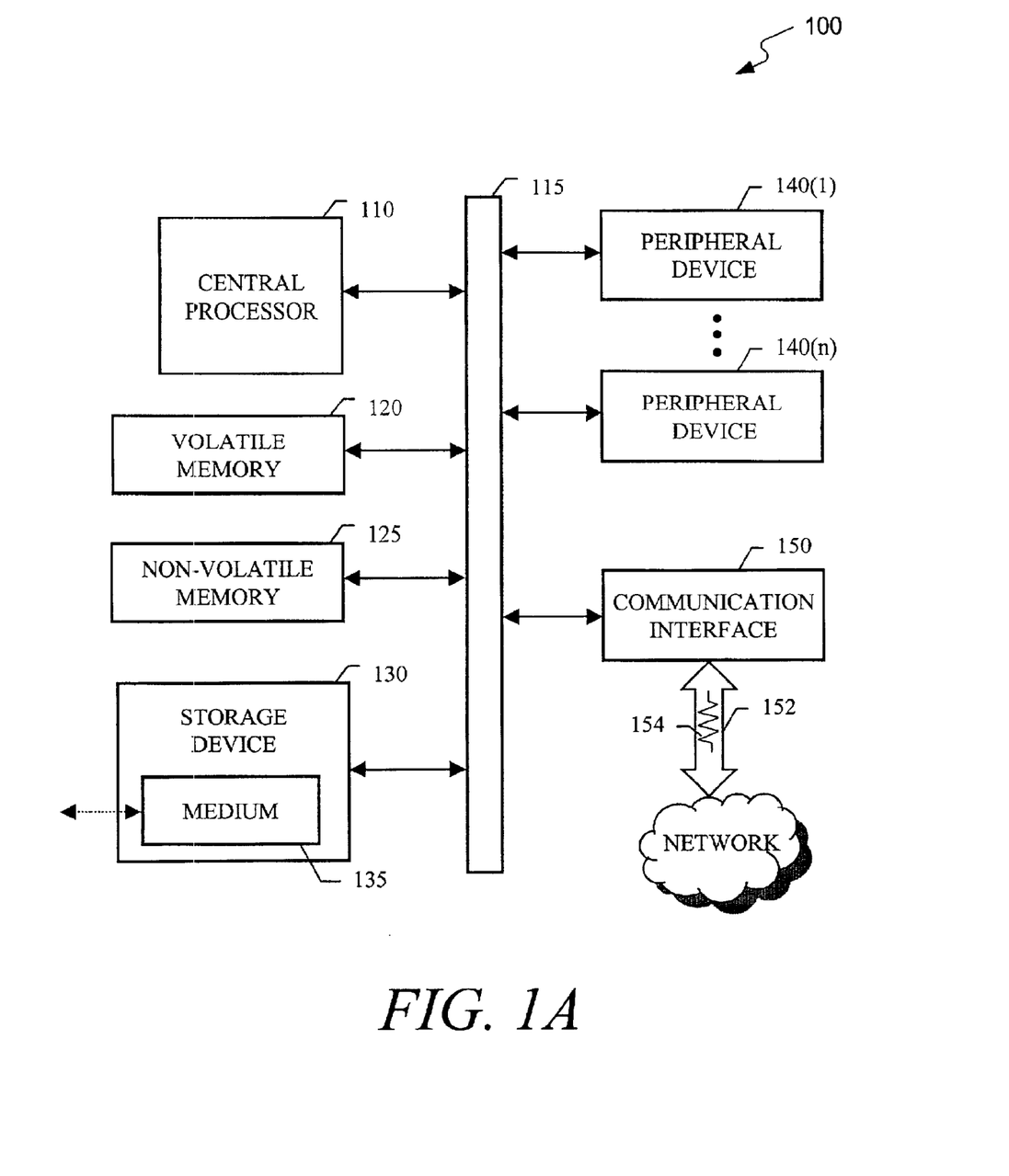
FIG. 1A is a block diagram illustrating an example data processing system.

FIG. 1A is a block diagram illustrating an example data processing system 100. The data processing system 100 includes a central processor 110, which executes programs, performs data manipulations and controls tasks in the system 100. The central processor 110 may include multiple processors or processing units and may be housed in a single chip (e.g., a microprocessor or microcontroller) or in multiple chips using one or more printed circuit boards or alternative inter-processor communication links (i.e., two or more discrete processors making up a multiple processor system). The central processor 110 is coupled with one or more communication busses 115.

The data processing system 100 includes a non-volatile memory 125 and also may include a volatile memory 120. The system 100 also may include one or more cache memories. The non-volatile memory 125 may be a memory device fabricated on a single semiconductor substrate, and may include a programmable control engine. Examples of the non-volatile memory 125 include non-volatile random access memory (NVRAM), ferroelectric random access memory (e.g., FRAM), ferromagnetic random access memory (FM-RAM), read-only memory (ROM), programmable read-only memory (PROM), erasable programmable read-only memory (EPROM), electrically erasable programmable read-only memory (EEPROM), flash memory (block oriented memory similar to EEPROM, such as flash NAND, flash NOR, and flash EPROM), and the like.

The data processing system 100 may include a storage device 130 for accessing a medium 135, which may be removable, read-only or read/write media and may be magnetic-based, optical-based or magneto-optical-based media. The data processing system 100 also may include one or more peripheral devices 140(l)–140(n) (collectively, devices 140), and one or more controllers and/or adapters for providing interface functions.

The system 100 may further include a communication interface 150, which allows software and data to be transferred, in the form of signals 154 over a channel 152, between the system 100 and external devices, networks or information sources. The signals 154 may embody instructions for causing the system 100 to perform operations. The system 100 represents a programmable machine, and may include various devices such as embedded controllers, Programmable Logic Devices (PLDs), Application Specific Integrated Circuits (ASICs), and the like. Machine instructions (also known as programs, software, software applications or code) may be stored in the machine 100 or delivered to the machine 100 over a communication interface.

These instructions include instructions used to program operational characteristics of the non-volatile memory 125 in accordance with the features and function described here. For example, these instructions may be microcode for the programmable control engine and may be stored in the non-volatile memory 125. These instructions represent controllers of the non-volatile memory 125.

Figure 1B:
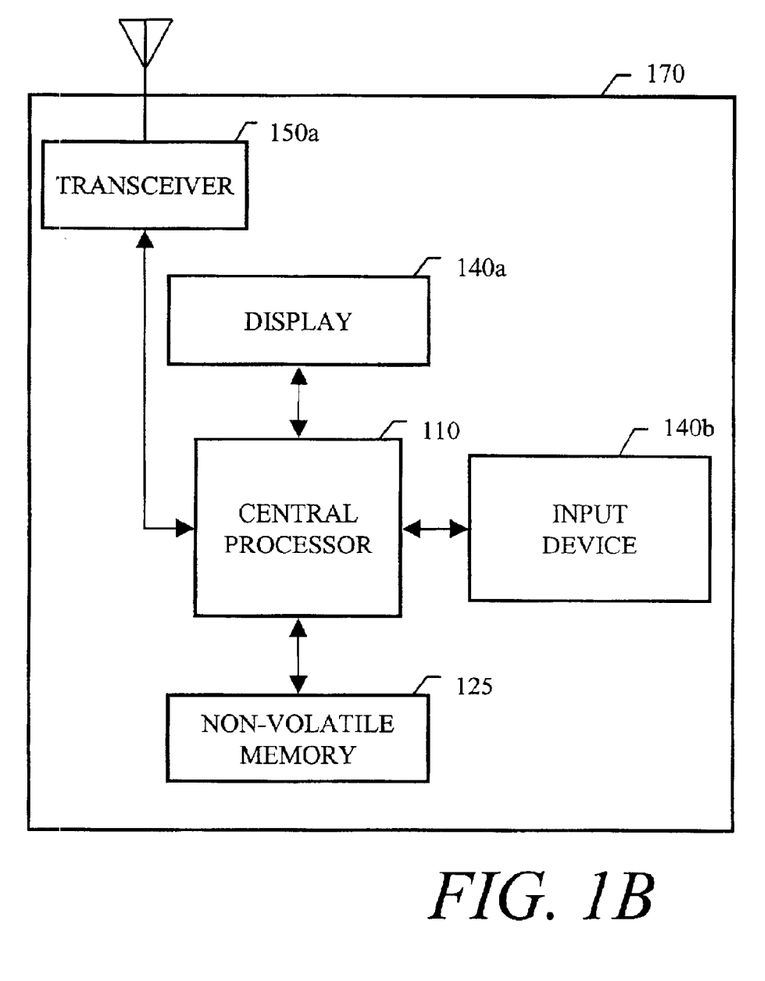
FIG. 1B is a block diagram illustrating an example mobile data processing machine.

FIG. 1B is a block diagram illustrating an example mobile data processing machine 170. The machine 170 includes a central processor 110 and a non-volatile memory 125, such as described above. The non-volatile memory 125 may be an electrically erasable and programmable non-volatile memory, such as an EEPROM. The machine 170 further includes instructions used to program operational characteristics of the non-volatile memory 125 in accordance with the features and function described below.

The machine 170 also may include a transceiver 150a (e.g., a radio transceiver), a display 140a, and/or an input device 140b. The machine 170 may be a cellular telephone, a personal digital assistant (PDA), a laptop, a digital camera, etc. The non-volatile memory 125 provides storage of programs and/or data for the machine 170, including during a powered down state.

Figure 1C:
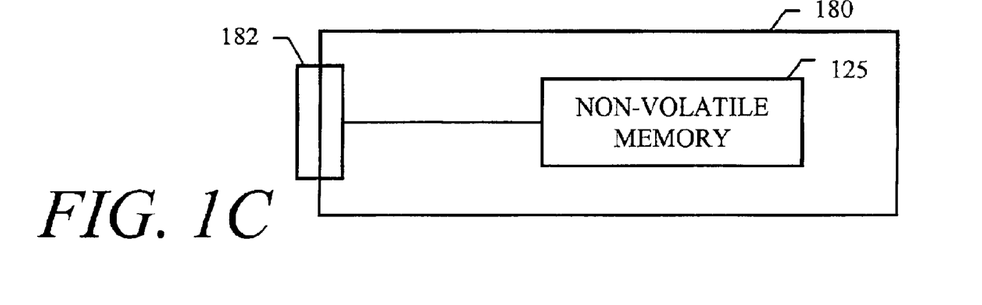
FIG. 1C is a block diagram illustrating an example memory component.

FIG. 1C is a block diagram illustrating an example memory component 180. The memory component 180 may be a memory card, a memory chip, a memory stick, etc. The memory component 180 includes a non-volatile memory 125, such as describe above, which may be an electrically erasable and programmable non-volatile memory. The memory component 180 also includes a connector 182, and may further include instructions used to program operational characteristics of the non-volatile memory 125 in accordance with the features and function described below. Alternatively, these instructions may be provided when the memory component 180 is installed in a machine, such as machines 100, 170, using the connector 182.

Figure 2A:
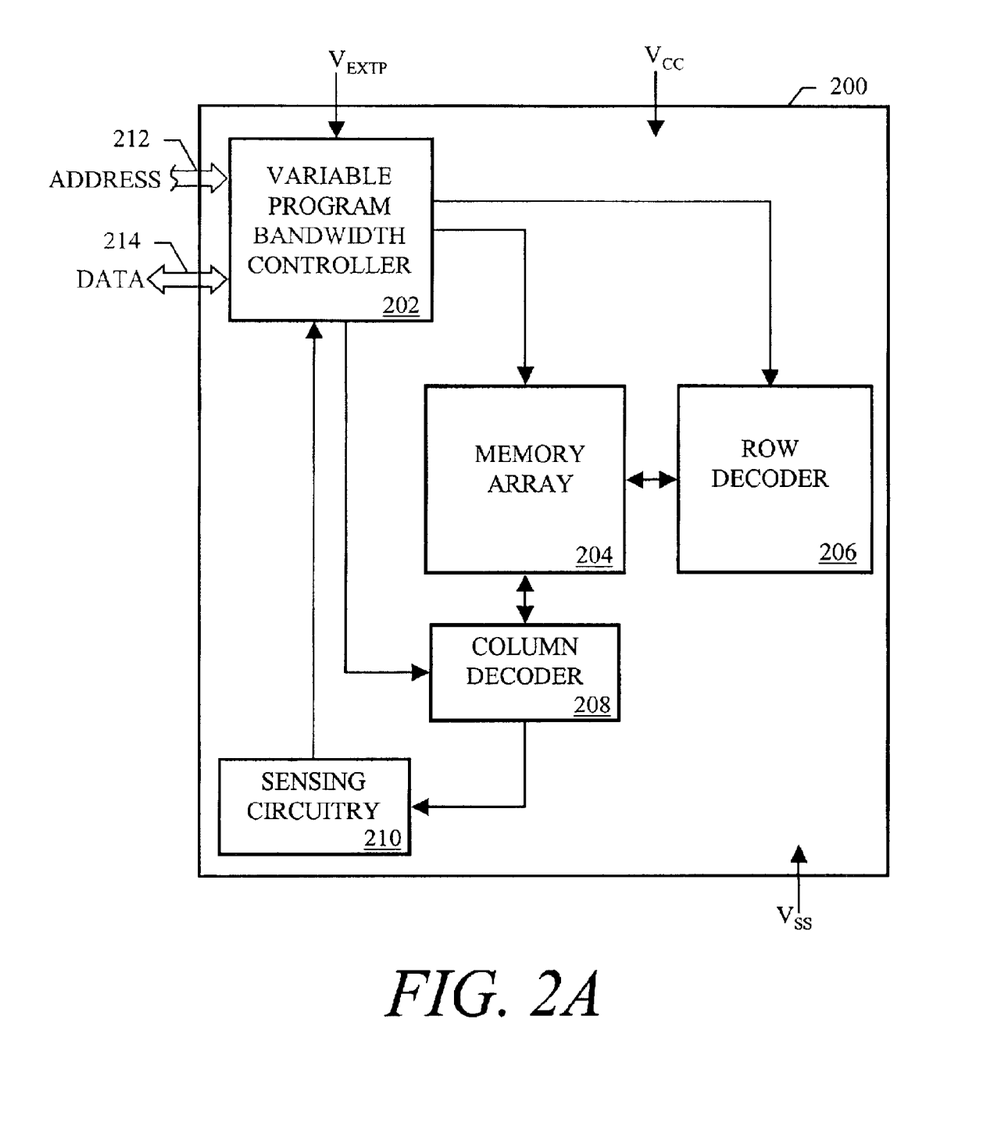
FIG. 2A is a block diagram illustrating an erasable and programmable non-volatile memory.

FIG. 2A is a block diagram illustrating an erasable and programmable non-volatile memory 200. The erasable and programmable non-volatile memory 200 receives addresses on an address bus 212 and sends and receives data on a data bus 214. The erasable and programmable non-volatile memory 200 includes a variable program bandwidth controller 202, an erasable and programmable non-volatile memory cell array 204, a row address decoder 206, a column address decoder 208, and sensing circuitry 210. The row address decoder 206 and the column address decoder 208 receive addresses from the address bus 212 or the variable program bandwidth controller 202 to select cells in the erasable and programmable non-volatile memory cell array 204. The selected cells may be read and/or programmed using the sensing circuitry 210 and the variable program bandwidth controller 202.

The variable program bandwidth controller 202 automatically varies the number of bits programmed in parallel based upon a programming voltage and a defined electrical current provisioning capability. For example, the variable program bandwidth controller 202 may automatically vary the number of bits programmed in parallel based upon whether a program pulse is an initial pulse or a re-pulse and/or based upon a cell level to be programmed by a pulse in a MLC device. The variable program bandwidth controller 202 may receive one or more control lines to selectively configure a number of bits to be programmed in parallel and a type of variation in this number. Additional control lines also may be provided to the erasable and programmable non-volatile memory 200 such as interrupts and output enable lines.

The variable program bandwidth controller 202 may be a programmable control engine that includes a microprocessor and a write enable control line to selectively latch in one or more instructions, where the latched-in instructions include mircocode that configures the variable program bandwidth controller 202 to vary the number of bits to be programmed in parallel during program pulsing. Alternatively, the variable program bandwidth controller 202 may be implemented as a state machine or by using combinational logic. The variable program bandwidth controller 202 also may be implemented as a semiconductor device that externally controls the operation of memory device 200.

The erasable and programmable non-volatile memory 200 also receives a positive power supply input $V_{CC}$ and a negative or ground power supply input $V_{SS}$. Optionally, the erasable and programmable non-volatile memory 200 may receive an external programming voltage $V_{EXTP}$, and include a corresponding programming voltage selector, to bypass the generation of an internal programming voltage by a charge pump (i.e., a program pump) from $V_{CC}$. In many operational environments $V_{CC}$ is a low voltage, thus limiting the amount of charge that can be generated by an internal charge pump. A user may provide a higher programming voltage with greater current provisioning capability externally through the $V_{EXTP}$ input in order to program more erasable and programmable non-volatile cells in parallel.

The erasable and programmable non-volatile memory 200 may be formed and manufactured using MOS (metal oxide semiconductor) technology, CMOS (complementary MOS) technology, BICMOS (bipolar CMOS) technology, or other semiconductor manufacturing technologies for forming a non-volatile memory that uses trapped charges to store data.

Figure 2B:
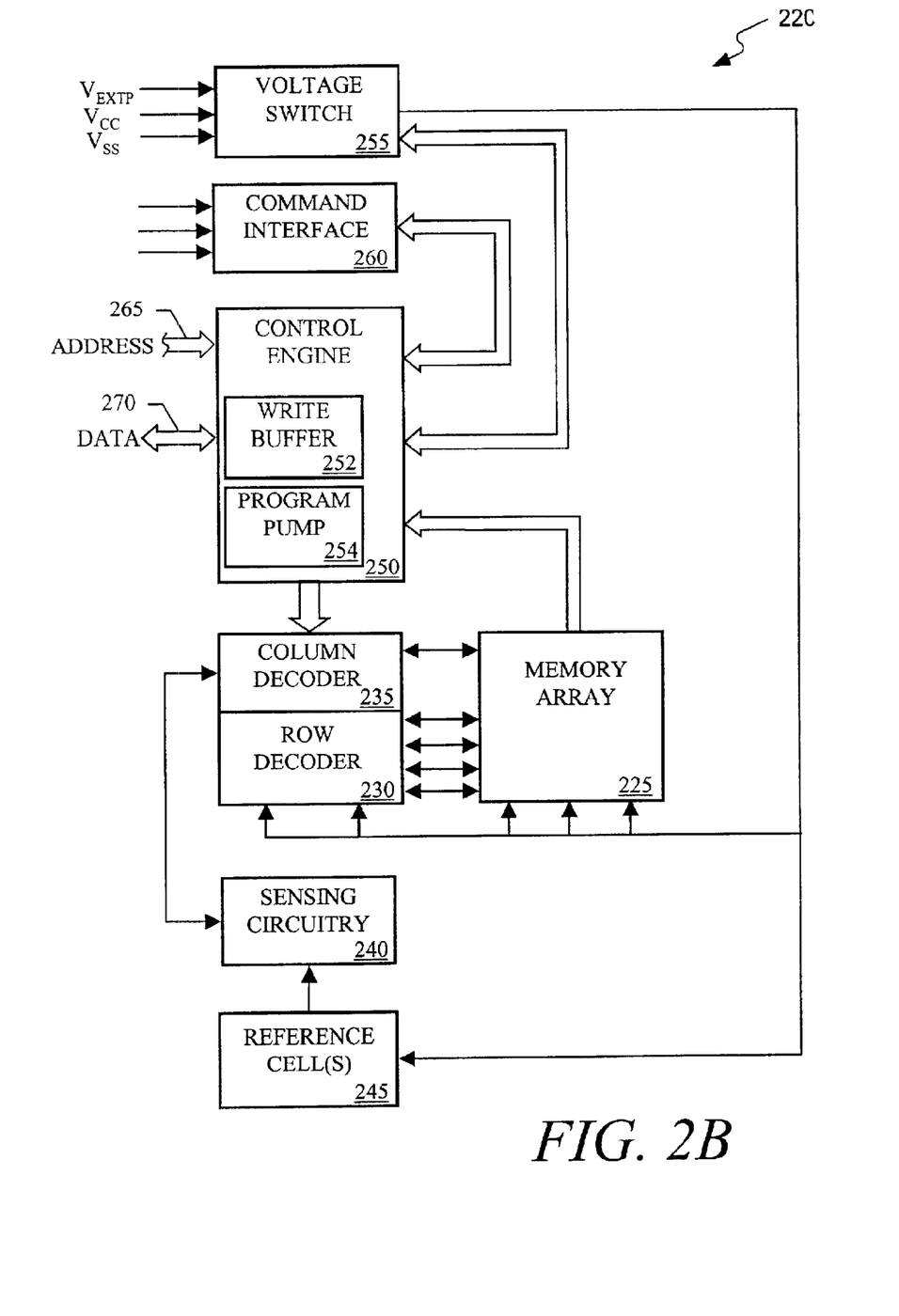
FIG. 2B is a block diagram illustrating an example erasable and programmable non-volatile memory device.

FIG. 2B is a block diagram illustrating an example erasable and programmable non-volatile memory device 220. The memory device 220 may be fabricated on a single semiconductor substrate. The memory device 220 includes a memory array 225, a row decoder 230, a column decoder 235, sensing circuitry 240, and a control engine 250. The memory device 220 also may include one or more reference cells 245, a voltage switch 255, and a command interface 260.

Memory device 220 receives address signals on address lines 265 and receives and sends data on bi-directional data lines 270. Data is stored using non-volatile memory cells within memory array 225. The memory array 225 may include any type of non-volatile memory cell with programmable threshold voltages. Examples of such memory cells may include cells with trapping dielectrics or floating gates. As an example, some memory cells may have a select gate, a floating gate, a source and a drain. Such memory cells may act as a field effect transistor having a threshold voltage that increases as charge is added to the floating gate. Moreover, each memory cell in the memory array 225 may store more than a single bit of data (e.g., MLC flash memory).

A charge pump 254 supplies current to program the memory cells. The charge pump 254 has an electrical current provisioning capability that is predefined by the size of the charge pump 254 and the manufacturing process. This predefined electrical current provisioning capability may be affected by variations in fabrication (i.e., process skew) and operational environments (e.g., temperature and voltage conditions), which may be defined by analysis of the manufacturing process and the operational environments. These predefined variations will effect the actual amount of electric current and voltage that can be supplied by the charge pump 254, thus affecting the maximum number of cells that may be programmed at any one time.

The memory device 220 may include a write buffer 252, which may use Static Random Access Memory (SRAM) for temporarily storing data with which to program the memory array 225. Write buffer 252 may be used in a MLC memory device 220, and may be selected to store at least enough data to program an optimum number of cells at a time, given the number of states stored in each cell.

To read data stored in memory array 225, the row decoder 230 and column decoder 235 select a number of memory cells of the memory array 225 in response to an address received on address lines 265. Row decoder 230 selects the appropriate row of memory array 225 and column decoder 235 selects the appropriate column (or columns) of memory array 225.

In the MLC memory device 220, sensing circuitry 240 compares the states of the selected memory cells to the states of reference cells 245. Sensing circuitry 240 may include differential comparators that provide digital logic voltage levels in response to the comparisons between memory cells and reference cells. Other techniques for comparing voltages also can be used. Thus, the analog states of the memory cells can be expressed as digital data.

The number of bits stored by a multi-level memory cell depends on 1) the number of different analog states in which the cell may be placed by programming circuitry and 2) the number of different analog states that can be determined accurately by sensing circuitry. Because the operating voltage range of the memory array is typically limited, as the number of states increases, the states become closer together.

When the states become closer together, the intermediate states should be placed more carefully to ensure accuracy and avoid confusion with other states. This may be done by incrementally raising the threshold voltage of a cell to an intermediate level. Thus, when programming cells to an intermediate level in a MLC memory device, the initial pulse pushes the cells toward the intermediate level, and later pulses are used to place the cells in the intermediate level.

Current MLC memory devices have four levels (i.e., L0, L1, L2 and L3 for levels 0 through 3 respectively) defined by guard bands to specify four different states. With four states, two bits of data may be stored in each cell. Future MLC memory devices will likely have more levels for greater storage capacity.

Regardless of the number of states in a MLC memory device, re-pulse and re-verify operations are generally the most time-consuming part of programming data into the device. The highest level in a MLC device will typically verify in fewer pulses than the intermediate levels because the voltage threshold (VT) for the highest level may be set further away from adjoining-level VT voltage than may be done for intermediate levels. Intermediate level voltages typically require more precise level setting to verify to the correct level and, therefore, may require more repulsing and verification operations. In one implementation, level L3 data typically uses one pulse in contrast to the 10–14 pulses for levels L1 and L2.

The control engine 250 may be a programmable control engine that includes a microprocessor, which is controlled by microcode stored in on-chip memory. Control engine 250 manages the memory array 225 by controlling the row decoder 230, the column decoder 235, the sensing circuitry 240, the one ore more reference cells 245, the charge pump 254 and voltage switch 255. Voltage switch 255 controls various voltage levels used to read, program and erase cells in memory array 225. Commands for reading, erasing and programming may be communicated to control engine 250 through the command interface 260.

Non-volatile multi-level cells may use one logical path for reading/verifying and another path for programming the multi-level cell. This allows the paths to be Read While Write (RWW) enabled and allows optimizations for programming.

Figure 3A:
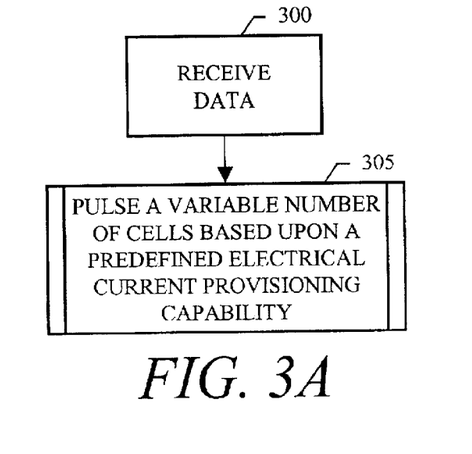
FIGS. 3A, 3B and 3C are flow charts illustrating methods of programming a non-volatile memory.
Figure 3B:
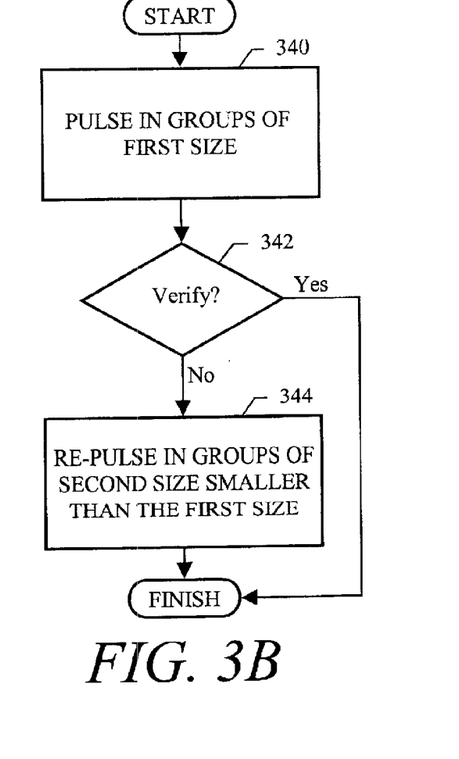
Figure 3C:
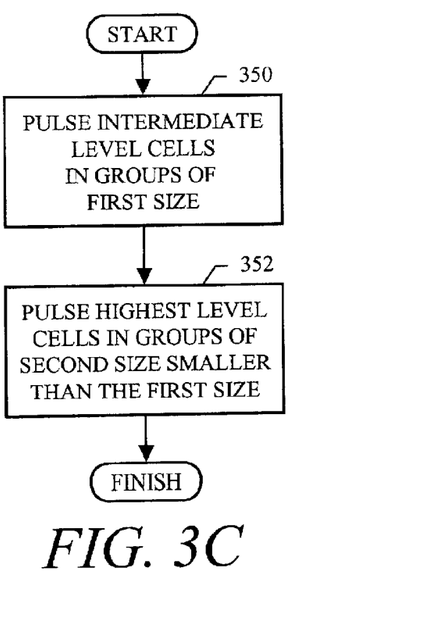

FIGS. 3A, 3B and 3C are flow charts illustrating methods of programming a non-volatile memory. Referring to FIG. 3A, the method begins when data to be stored in a non-volatile memory is received (300). The non-volatile memory may be as described above, for example, the memory may include storage cells and a charge pump having a predefined electrical current provisioning capability.

Next, a variable number of cells in the memory are pulsed, where the variation in programming number (i.e., the number of cells programmed in parallel) is based upon a predefined electrical current provisioning capability (305). By automatically varying the programming number of the storage cells during program pulsing, various advantages in storage speed and/or reduced charge pump size for the memory may be achieved.

The variation in programming number may be based upon whether a program pulse comprises an initial pulse or a re-pulse. FIG. 3B illustrates this type of variation. The program pulsing starts by pulsing in groups of a first size (340). Then, a verification operation is performed on the programmed cells (342). If the cells fail to verify, the cells are re-pulsed in groups of a second size that is smaller than the first (344).

Many non-volatile memories use an overbuilt program pump, in order to account for predefined variations in program pump performance given process skew and actual operationing conditions. A variable program bandwidth, as described above, may take advantage of an overbuilt program pump by first attempting to program more cells in parallel than the program pump is designed to support, given predefined variations in the electrical current provisioning capability of the program pump. Thus, the excess capability of the program pump may be translated into improved program performance.

Alternatively, this type of variable program bandwidth approach may be used to reduce the die size of a memory device that would otherwise need to be larger to guarantee all produced devices are functional and meet performance requirements regardless of fabrication process variation and temperature and voltage conditions. This variable program bandwidth may be implemented as microcode in a memory device, such as a flash device, and may be used in both SBC and MLC devices.

Moreover, in MLC devices, variable program bandwidth based on whether a program pulse comprises an initial pulse or a re-pulse may be used to increase speed for the intermediate levels to be programmed. For example, in MLC flash devices, intermediate levels typically are pulsed and re-pulsed as a matter of course, to ensure accurate placement of the VT. The program pulse on the first pulse may be at a bandwidth supported by the program pump across all process variation, temperature and voltage conditions. During the initial pulse, the cell has the greatest electric field and consumes the highest cell current. Thus, the re-pulses may occur at a higher bandwidth since there is less demand (i.e., lower program current) on the program pump during each re-pulse.

The variation in programming number also may be based upon a cell level to be programmed by a pulse in a MLC device. FIG. 3C illustrates this type of variation. The program pulsing starts by pulsing intermediate level cells in groups of a first size (350). Then, highest level cells are pulsed in groups of a second size that is smaller than the first (352).

Many MLC devices have a program pump that is designed to supply current based on a worst-case level program cell current. Thus, the pump is designed to supply enough current for the highest level cell at a specified program bandwidth. But in many devices, the next lower level (i.e., the highest intermediate level) needs a current that is less than seventy percent of the current needed by the highest level.

By designing the program pump to the needs of an intermediate level (e.g., level two in a four level MLC flash device) instead of the highest level, the program pump size may be reduced or programming speed may be increased. The variable program bandwidth allows the highest level cells to still be effectively programmed because these cells are programmed in smaller groups.

For example, in a four level MLC flash device, the level three cells represent the upper VT boundary. Thus, the width distribution of these cells is not critical, and these cells may typically be programmed using a single pulse. In contrast, the level two and level one cells are programmed using iterative pulsing with incremental wordline gate steps to ensure a tight VT distribution around each level. Because of this, most of the time spent programming is spent programming the level one and level two cells (typically eighty percent of entire program time). This type of variable program bandwidth allows the level one and level two cells to be programmed efficiently, while the pulse-time penalty introduced by the lower program bandwidth used with the level three cells is offset by the corresponding reduction in program pump size.

The methods of FIGS. 3B and 3C may also be combined in a single device. In addition, the variable programming number may be made dynamically adaptive by adjusting the programming bandwidth based on the real-time program performance and cell current requirements.

Figure 4:
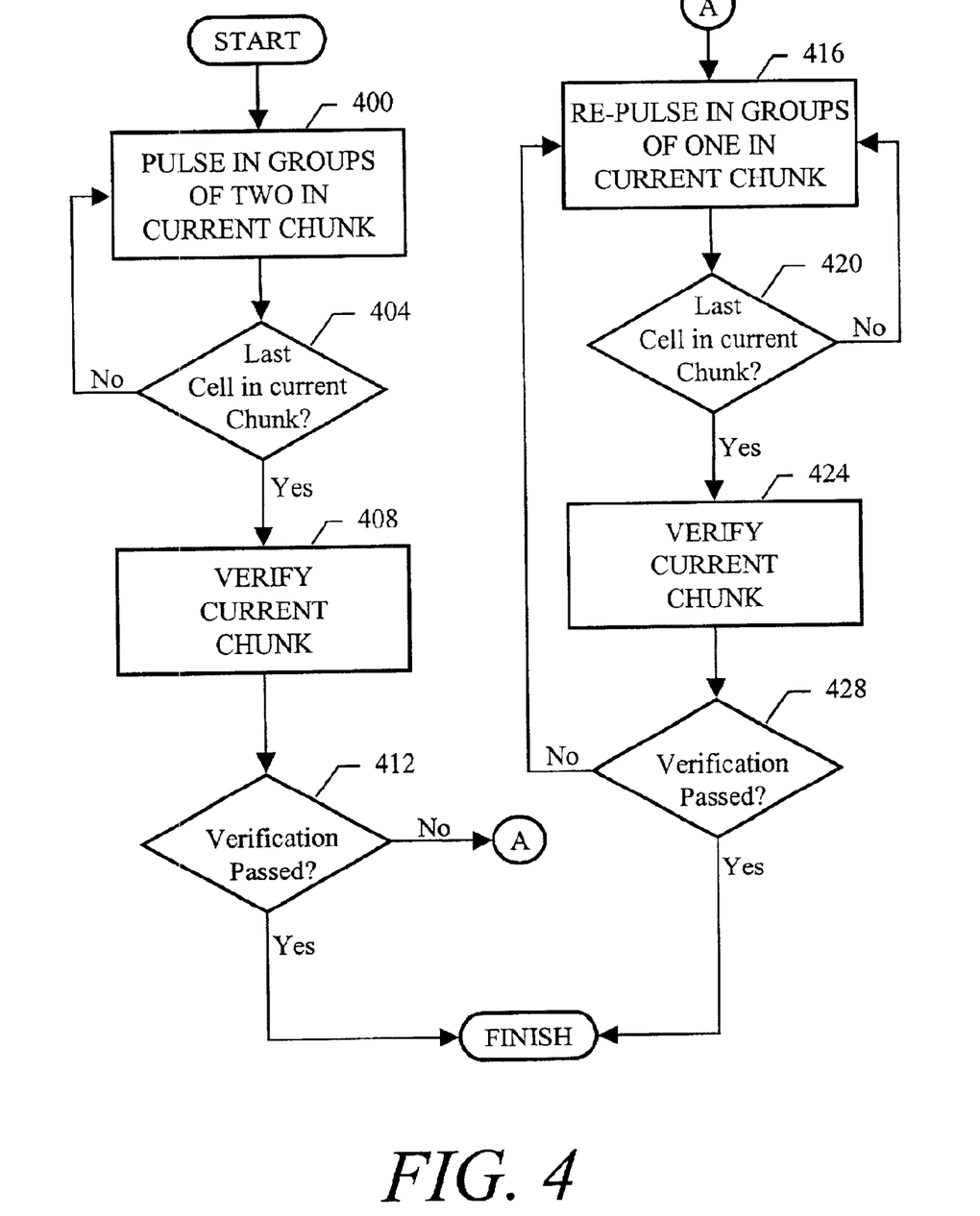
FIG. 4 is a flow chart illustrating a method of programming a current chunk in a SBC flash memory.

FIG. 4 is a flow chart illustrating a method of programming a current chunk in a SBC flash memory. The method starts by pulsing in groups of two in a current chunk to be programmed (400). This program pulsing continues until the last cell in the current chunk has been pulsed (404). Next, the current chunk is verified (408). If the verification passes for the current chunk, the current chunk has been fully programmed (412).

Otherwise, the cells to be programmed in the current chunk are re-pulsed in groups of one (416); flow passes from (412) to (416) through circle A. This program re-pulsing continues until the last cell in the current chunk has been re-pulsed (420). Next, the current chunk is verified (424). If the verification passes for the current chunk, the current chunk has been fully programmed (428). Otherwise, the current chunk is re-pulsed until all the cells to be programmed verify.

Figure 5A:
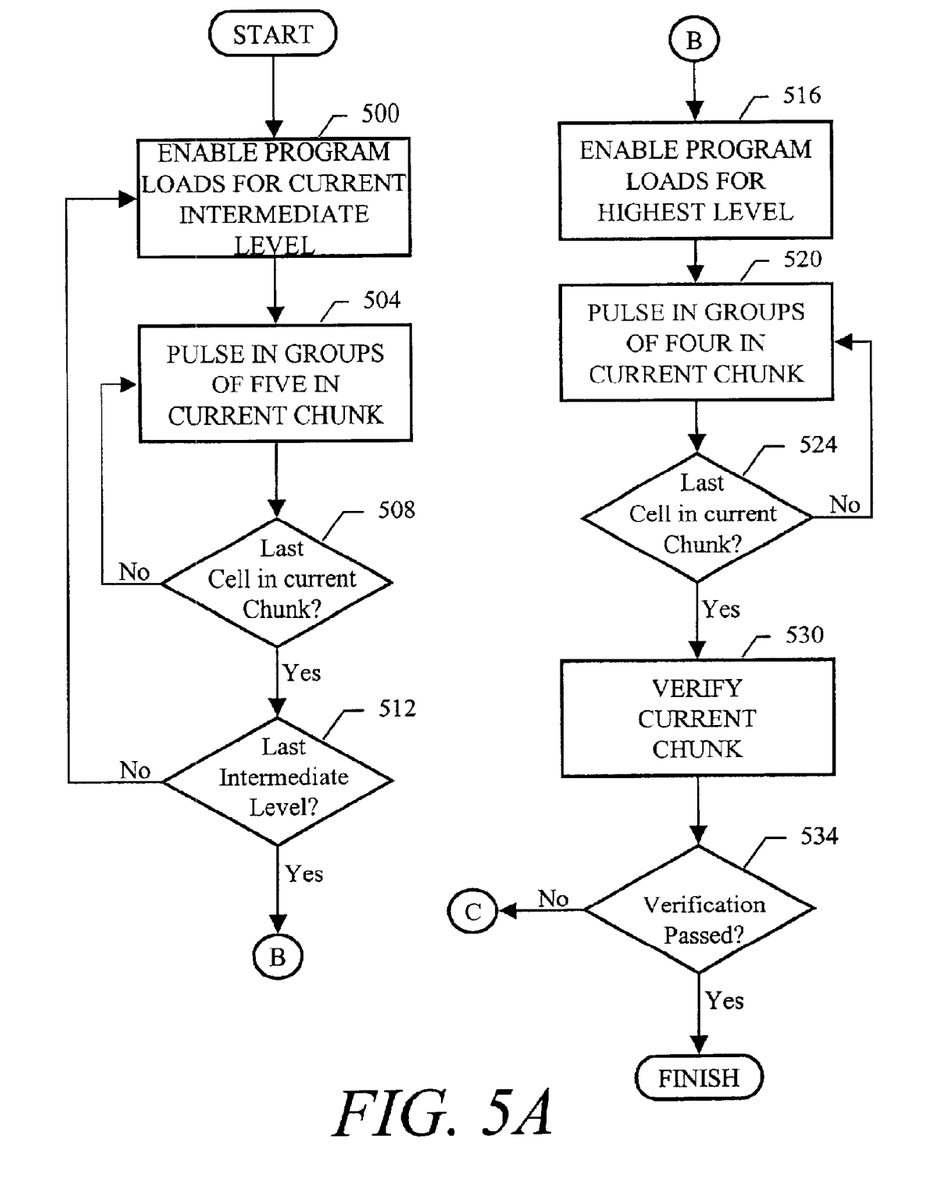
FIGS. 5A and 5B are a flow chart illustrating a method of programming a current chunk in a MLC flash memory.
Figure 5B:
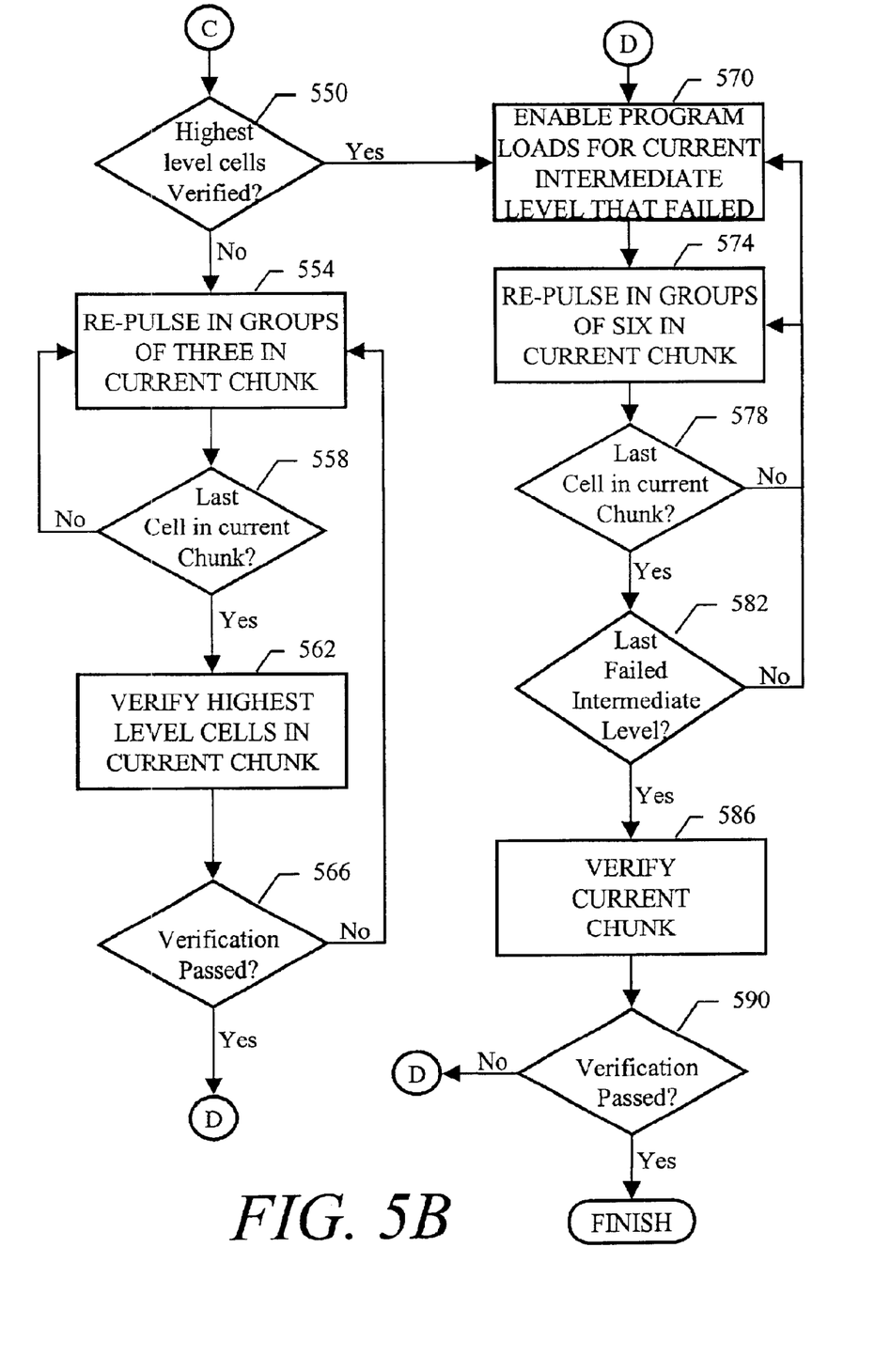

FIGS. 5A and 5B are a flow chart illustrating a method of programming a current chunk in a MLC flash memory. The method starts by enabling program loads for a current intermediate level (500). For example, a gate may be set to a voltage for level one programming. Then, cells in a current chunk to be programmed to the current level are pulsed in groups of five (504). This program pulsing continues until the last cell in the current chunk to be programmed to the current level has been pulsed (508). Additionally, while more intermediate levels remain, the cells in the current chunk to be programmed to these remaining intermediate levels are also pulsed in groups of five (512).

When all the intermediate level cells have been pulsed, program loads for the highest level are enabled (516); flow passes from (512) to (516) through circle B. Then, cells in the current chunk to be programmed to the highest level are pulsed in groups of four (520). This program pulsing continues until the last cell in the current chunk to be programmed to the highest level has been pulsed (524). Next, the current chunk is verified (530). If the verification passes for the current chunk, the chunk has been fully programmed (534).

Typically, at least the intermediate levels will need to be re-pulsed. Referring now to FIG. 5B. when verification of the current chunk is not passed, a check is made to determine if all the highest level cells verified (550); flow passes from (534) to (550) through circle C. If not, these cells are re-pulsed in groups of three in the current chunk (554). This re-pulsing continues until the last cell in the current chunk to be programmed to the highest level has been re-pulsed (558). Then, the highest level cells are verified in the current chunk (562). If the verification of the highest level cells is not passed, these cells are re-pulsed until they verify (566).

Once the highest level cells have verified, program loads for an intermediate level that failed to verify are loaded (570); flow passes from (566) to (570) through circle D. Then, cells in the current chunk to be programmed to the current level are re-pulsed in groups of six (574). This re-pulsing continues until the last cell in the current chunk to be programmed to the current level has been re-pulsed (578). Additionally, while more intermediate levels that failed to verify remain, the cells in the current chunk to be programmed to these remaining intermediate levels are also re-pulsed in groups of six (582).

When all the intermediate level cells have been re-pulsed, the current chunk is verified (586). If the verification passes for the current chunk, the current chunk has been fully programmed (590). Otherwise, the intermediate levels are re-pulsed until the current chunk verifies; flow passes from (590) to (570) through circle D.

The method depicted in FIGS. 5A and 5B may be implemented in an MLC flash device having a write buffer as described above (e.g., a write buffer of 512 bits, and a chunk size of 64 cells). Moreover, modification of the methods described above are also possible. For example, the increase in programming number from pulse to re-pulse of the intermediate levels may be eliminated, or the variation in programming number based on whether a pulse or a re-pulse is being delivered may be eliminated (leaving only variation based on cell level to be programmed).

Moreover, the numbers used in the variations of program bandwidth also may be changed. For example, instead of pulsing intermediate levels in groups of five cells and the highest level in groups of four cells, the numbers may be five and three, or ten and six, etc., depending on the program pump design.

Additionally, if more than four levels are used in an MLC device, the method may change slightly to accommodate the new levels. For example, in an MLC device with eight levels, the program pump may be designed to cover the first four or five levels, and the program bandwidth may then be changed for the higher levels. In general, the program pump is designed to cover a worst-case current specification, and this worst-case current is then scaled up or down to cover the number of cells to be programmed in parallel.

The various implementations described above have been presented by way of example only, and not limitation. For example, the logic flows depicted in FIGS. 3B-5B do not require the particular order shown, or sequential order. Other embodiments may be within the scope of the following claims.

What is claimed is:

1. A machine-implemented method comprising:
   receiving data to be stored in a non-volatile memory device comprising multi-level storage cells and a charge pump having a predefined electrical current provisioning capability;
   varying a programming number of the storage cells based upon the predefined electrical current provisioning capability of the charge pump and based upon a cell level to be programmed by a pulse; and
   pulsing the varying programming number of the storage cells in the memory device to store the received data in the memory device.

2. The method of claim 1, wherein the non-volatile memory device comprises an electrically erasable and programmable non-volatile memory device.

3. The method of claim 2, wherein said pulsing the varying programming number of the storage cells comprises:
   pulsing a first set of cells to push those cells to an intermediate level, the pulsing of the first set of cells occurring in groups of two or more cells, each group having a first size corresponding to the predefined electrical current provisioning capability of the charge pump; and
   pulsing a second set of cells to push those cells to a highest level, the pulsing of the second set of cells occurring in groups of one or more cells, each group having a second size smaller than the first size.

4. A machine-implemented method comprising:
   receiving data to be stored in a non-volatile memory device comprising storage cells and a charge pump having a predefined electrical current provisioning capability;
   varying a programming number of the storage cells based upon the predefined electrical current provisioning capability of the charge pump and based upon whether a program pulse comprises an initial pulse or a re-pulse; and
   pulsing the varying programming number of the storage cells in the memory device to store the received data in the memory device.

5. The method of claim 4, wherein said pulsing the varying programming number of the storage cells comprises:
   initially pulsing a set of cells to push the set of cells above a defined threshold, the initial pulsing of the set of cells occurring in groups of two or more cells, each group having a first size larger than that necessary to support predefined variations given the predefined electrical current provisioning capability of the charge pump;
   performing a verification operation on the set of cells; and
   if the set of cells fail to verify, re-pulsing the set of cells in groups of one or more cells, each group having a second size smaller than the first size.

6. The method of claim 5, wherein the storage cells comprise multi-level electrically erasable and programmable non-volatile memory cells, the set of cells comprise a first set of cells, and the defined threshold corresponds to a highest level in the multi-level electrically erasable and programmable non-volatile memory cells, and wherein said pulsing the varying programming number of the storage cells further comprises:
   pulsing a second set of cells to push those cells toward an intermediate level, the pulsing of the second set of cells occurring in groups of one or more cells, each group having a third size corresponding to the predefined electrical current provisioning capability of the charge pump; and
   re-pulsing the second set of cells to push those cells to the intermediate level, the re-pulsing of the second set of cells occurring in groups of two or more cells, each group having a fourth size larger than the third size.

7. A memory comprising:
   an array of multi-level electrically erasable and programmable non-volatile memory cells;
   a charge pump having an electrical current provisioning capability; and
   a variable program bandwidth controller configured to program a varying number of the non-volatile memory cells, which varying number is based upon the electrical current provisioning capability of the charge pump and based upon a cell level to be programmed by a pulse.

8. The memory of claim 7, wherein the non-volatile memory cells comprise flash memory cells.

9. The memory of claim 7, wherein the variable program bandwidth controller pulses a first set of cells in groups of two or more cells to push those cells to an intermediate level, each group of two or more cells having a first size corresponding to the electrical current provisioning capability, and wherein the variable program bandwidth controller pulses a second set of cells in groups of one or more cells to push those cells to a highest level, each group of one or more cells having a second size smaller than the first size.

10. A memory comprising:
    an array of electrically erasable and programmable non-volatile memory cells;
    a charge pump having an electrical current provisioning capability; and
    a variable program bandwidth controller configured to program a varying number of the non-volatile memory cells, which varying number is based upon the electrical current provisioning capability of the charge pump and based upon whether a program pulse comprises an initial pulse or a re-pulse.

11. The memory of claim 10, wherein the variable program bandwidth controller pulses a set of cells in groups of two or more cells to push the set of cells above a defined threshold, each group of two or more cells having a first size larger than that necessary to support predefined variations given the electrical current provisioning capability, and wherein the variable program bandwidth controller re-pulses the set of cells in groups of one or more cells if the set of cells fail to verify, each group of one or more cells having a second size smaller than the first size.

12. The memory of claim 11, wherein the non-volatile memory cells comprise multi-level electrically erasable and programmable non-volatile memory cells, and the defined threshold corresponds to a highest level in the multi-level electrically erasable and programmable non-volatile memory cells.

13. The memory of claim 12, wherein the variable program bandwidth controller comprises a programmable control engine that has been programmed using a control line to enable latching of a command into a microcode program controller.

14. A system comprising:
an electrically erasable and programmable non-volatile memory;
a charge pump coupled with the non-volatile memory; and
an execution area configured to program the electrically erasable and programmable non-volatile memory using a variable program bandwidth that varies based upon a cell level to be programmed by a pulse.

15. The system of claim 14, wherein the variable program bandwidth varies dynamically based upon real-time program performance and cell current requirements.

16. A system comprising:
an electrically erasable and programmable non-volatile memory;
a charge pump coupled with the non-volatile memory; and
an execution area configured to program the electrically erasable and programmable non-volatile memory using a variable program bandwidth that varies based upon whether a program pulse comprises an initial pulse or a re-pulse.

17. The system of claim 16, wherein the variable program bandwidth varies dynamically based upon real-time program performance and cell current requirements.

18. The system of claim 16, wherein the electrically erasable and programmable non-volatile memory comprises a flash memory.

19. The system of claim 18, further comprising a detachable flash memory stick comprising a programmable control engine, the flash memory, the charge pump and the execution area.

20. The system of claim 19, further comprising a transceiver.

21. Microcode for a programmable control engine for a non-volatile memory, the microcode comprising:
instructions to vary a memory programming bandwidth based upon a predefined electrical current provisioning capability and based upon whether a program pulse comprises an initial pulse or a re-pulse; and
instructions to pulse at the varying memory programming bandwidth to store data.

22. The microcode of claim 21, wherein said instructions to pulse comprise:

instructions to pulse a set of cells to push the set of cells above a defined threshold, the pulsing of the set of cells occurring in groups of two or more cells;
instructions to verify the set of cells; and
failure-condition instructions to re-pulse the set of cells in groups of one or more cells, each group having a second size smaller than the first size.

23. The microcode of claim 21, wherein said instructions to vary a memory programming bandwidth further comprise instructions to vary the memory programming bandwidth based upon a cell level to be programmed by a pulse.

24. The microcode of claim 23, wherein said instructions to pulse comprise:
instructions to pulse a first set of cells to push those cells to an intermediate level, the pulsing of the first set of cells occurring in groups of three or more cells, each group having a first size;
instructions to pulse a second set of cells to push those cells to a highest level, the pulsing of the second set of cells occurring in groups of two or more cells, each group having a second size smaller than the first size;
instructions to verify cells; and
failure-condition instructions to re-pulse the second set of cells in groups of one or more cells, each group having a third size smaller than the second size.

25. The microcode of claim 24, wherein said instructions to pulse further comprise:
failure-condition instructions to re-pulse the first set of cells to push those cells to the intermediate level, the re-pulsing of the first set of cells occurring in groups of four or more cells, each group having a fourth size larger than the first size.

26. A machine-readable medium embodying information indicative of instructions for causing one or more machines to perform operations comprising:
receiving data to be stored in a non-volatile memory device comprising storage cells and a charge pump having a predefined electrical current provisioning capability;
varying a programming number of the storage cells based upon the predefined electrical current provisioning capability of the charge pump and based upon a cell level to be programmed by a pulse; and
pulsing the varying programming number of the storage cells in the memory device to store the received data in the memory device.

27. A machine-readable medium embodying information indicative of instructions for causing one or more machines to perform operations comprising:
receiving data to be stored in a non-volatile memory device comprising storage cells and a charge pump having a predefined electrical current provisioning capability;
varying a programming number of the storage cells based upon the predefined electrical current provisioning capability of the charge pump and based upon whether a program pulse comprises an initial pulse or a re-pulse; and
pulsing the varying programming number of the storage cells in the memory device to store the received data in the memory device.

28. Microcode for a programmable control engine for a non-volatile memory, the microcode comprising:
instructions to vary a memory programming bandwidth based upon a predefined electrical current provisioning capability and based upon a cell level to be programmed by a pulse; and instructions to pulse at the varying memory programming bandwidth to store data.

29. The microcode of claim 28, wherein said instructions to pulse comprise:

instructions to pulse a first set of cells to push those cells to an intermediate level, the pulsing of the first set of cells occurring in groups of two or more cells, each group having a first size; and instructions to pulse a second set of cells to push those cells to a highest level, the pulsing of the second set of cells occurring in groups of one or more cells, each group having a second size smaller than the first size.

* * * * *